(12) United States Patent
Ohkubo et al.

(10) Patent No.: US 6,477,844 B2
(45) Date of Patent: Nov. 12, 2002

(54) THERMOELECTRIC CONVERSION DEVICE AND METHOD OF MANUFACTURING THE SAME

(75) Inventors: Hideaki Ohkubo, Hiratsuka (JP); Masanobu Seki, Hiratsuka (JP); Mineo Tokuda, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/985,915

(22) Filed: Nov. 6, 2001

(65) Prior Publication Data

US 2002/0062649 A1 May 30, 2002

(30) Foreign Application Priority Data

Nov. 13, 2000 (JP) ........................................ 2000-345336

(51) Int. Cl.$^7$ ............................................... F25B 21/02
(52) U.S. Cl. ......................................................... 62/3.7
(58) Field of Search .............................. 62/3.1, 3.2, 3.3, 62/3.7

(56) References Cited

U.S. PATENT DOCUMENTS 4,744,220 A * 5/1988 Kerner et al. ................... 62/3

* cited by examiner

Primary Examiner—Denise L. Esquivel
Assistant Examiner—Melvin Jones
(74) Attorney, Agent, or Firm—Varndell & Varndell, PLLC

(57) ABSTRACT

A sealing structure of the thermoelectric conversion device, which has high sealing capability and is easy to manufacture, is provided. A thermoelectric conversion circuit utilizing Peltier effect is interposed between two metal heat exchanger plates. The O-ring interposed between the outer edge portions of the heat exchanger plates seals the gap formed between the outer edge portions of the heat exchanger plates along the whole periphery. The connector for connecting the thermoelectric conversion circuit to the external power supply is inserted into the through hole formed on the heat exchanger plate. The O-ring fitted on the connector seals the gap between the connector and the through hole spontaneously, when the connector is inserted into the through hole.

4 Claims, 8 Drawing Sheets

THERMOELECTRIC CONVERSION DEVICE AND METHOD OF MANUFACTURING THE SAME

BACKGROUND OF THE INVENTION

1. Field of the Invention

The present invention relates to a thermoelectric conversion device using Peltier effect or Seebeck effect of a semiconductor, and more specifically, to a sealing structure for preventing water from entering from the exterior to the interior of the device, and an improved structure of electric connection between the interior and the exterior of the device.

2. Description of the Related Art

In general, the thermoelectric conversion device of this type is, as shown in Japanese Patent Laid-Open No. 207762/1994 for example, a sandwich construction in which a thermoelectric conversion circuit including a plurality of P-type semiconductor devices and N-type semiconductor device arranged in two-dimensional matrix and connected electrically in series is sandwiched between two plates, and two leads extending from the thermoelectric conversion circuit are drawn out of the plates for connection with the external power supply. When a direct current is passed through the thermoelectric conversion device, it serves as a heat pump in which the plate on one side absorbs heat and the plate on the other side discharges heat, or in contrast to it, heating the plate on one side and cooling the plate on the other side generates a direct current.

Such thermoelectric conversion device often used is in the field of the cooling apparatus. Therefore, the gap (typically the gap between the outer edge portions of two plates) around the outer periphery of the device must be sealed in order to prevent water generated outside of the device due to dew condensation or the like from entering the thermoelectric conversion circuit in the device.

From this point of view, the thermoelectric conversion device disclosed in Japanese Patent Laid-Open No. 207762/1994 is provided with an O-ring interposed in the gap between the outer edge portions of two plates all over the periphery, and the two plates are tightened with a bolt so that they come in close contact with the O-ring. In addition, an adhesive is circumferentially filled in the groove formed between two plates on the outer periphery of the O-ring. Such a double sealing structure using the O-ring and an adhesive ensures sealing the gap between the outer edge portions of those two plates. In addition, a through hole is formed through one of the plate, through which the lead extending form the thermoelectric conversion circuit passes. The gap between the through hole and the lead is sealed with an adhesive filled therein.

In the thermoelectric conversion device disclosed in Japanese Patent Laid-Open No. 207762/1994, disadvantageously, a close attention must be paid to the steps for manufacturing the seal in the gap between the through hole and the lead, and thus it needs lots of time and troublesome process management. In other words, the process comprises the steps of passing the lead through the through hole, filling an adhesive in the gap between the through hole and the lead, and curing the adhesive. It is required to stand the device still so as not to touch or vibrate the lead during the time period from the time when the adhesive is filled until it is completely cured. Otherwise, the lead moves in the through hole, which generates a gap between the adhesive and the lead or the like, and thus the perfect seal cannot be made. Therefore, the sealing structure of the thermoelectric conversion device in the related art is not actually suitable for effective manufacture in the factory.

SUMMARY OF THE INVENTION

Accordingly, it is an object of the present invention to provide a sealing structure of the thermoelectric conversion device that has high sealing capability and can be manufactured in a simple manner.

The thermoelectric conversion device according to the present invention constructed of a thermoelectric conversion circuit interposed between two plates comprises: an outer edge sealing member for enclosing the outer periphery of the thermoelectric conversion circuit to seal the gap between the outer edge portions of two plates, a through hole formed on at least one of the two plates from the inner surface through the outer surface, a connector passed through the through hole and connected at one end to the thermoelectric conversion circuit for connecting the thermoelectric conversion circuit to the external power supply, and a connector sealing member that is constructed to seal the gap between the connector and the through hole spontaneously when the connector is inserted through the through hole and fixed at the prescribed position.

The thermoelectric conversion device comprises a connector for connecting the thermoelectric conversion circuit in the device to the external power supply, and the connector is inserted through the through hole that passes through the plates sandwiching the thermoelectric conversion circuit. The connector sealing member for sealing the gap between the connector and the through hole is constructed to seal the gap between the connector and the through hole spontaneously in the course of inserting the connector through the through hole and fixing the same at the prescribed position. Therefore, since the seal between the connector and the through hole is completed spontaneously by the step of inserting the connector into the through hole and fixing the same at the prescribed position in a method of manufacturing the device, it can be manufactured easily and exhibits high sealing capability.

For example, an O-ring that is fitted on the connector may be used as a connector-sealing member. The O-ring is brought into close contact with the surface of the connector and the inner peripheral surface of the through hole, or is brought into close contact with the surface of the connector and the surface of the plate around the through hole, and seals the gap formed there between spontaneously in the course of inserting it through the through hole and fixing the same at the prescribed position. In this way, the sealing operation is easy, and preferable sealing effect can be realized since the sealing capability of the O-ring itself is significantly high.

In one preferable embodiment, the outer diameter of the portion inserted into the through hole of the connector is almost the same as the inner diameter of the through hole. Therefore, the connector does not unnecessarily rattle in the through hole when it is inserted into the through hole, which contributes to the simplification of the operation and improvement of the sealing capability. When the outer diameter of the portion inserted through the through hole of the connector is almost the same as the inner diameter of the through hole, a sealing tape can be used as a connector-sealing member instead of the O-ring. In other words, the seal is completed simply by the steps of winding a suitable amount of the sealing tape on the outer periphery of the portion to be inserted into the through hole of the connector, and inserting the same through the through hole. The portion to be inserted through the through hole of the connector and the through hole may be engaged by the male screw and the female screw.

One preferable embodiment comprises a through hole formed on the plate described above from the inner surface through the outer side surface, and the connecter inserted therein extends out from the side surface of the thermoelectric conversion device.

The thermoelectric conversion device according to the present invention can be manufactured by the method comprising the steps of; sandwiching the thermoelectric conversion circuit between two plates; enclosing the outer periphery of the thermoelectric conversion circuit to seal the gap between the outer edge portions of two plates by means of outer edge sealing member, forming a through hole on at least one of the two plates from the inner surface through the outer surface, inserting the connector for connecting the thermoelectric conversion circuit to the outer power supply though the through hole and fixing the prescribed position, connecting one end of the connector to the thermoelectric conversion circuit, and using the connector-sealing member so as to seal the gap between the connector and the through hole spontaneously when the connector is inserted through the through hole and fixed at the prescribed position. These steps do not have to be performed in the order shown above, and they may be performed in the different order according to the specific construction of the thermoelectric conversion device and convenience in manufacturing.

DESCRIPTION OF THE PREFERRED EMBODIMENTS

Figure 1:
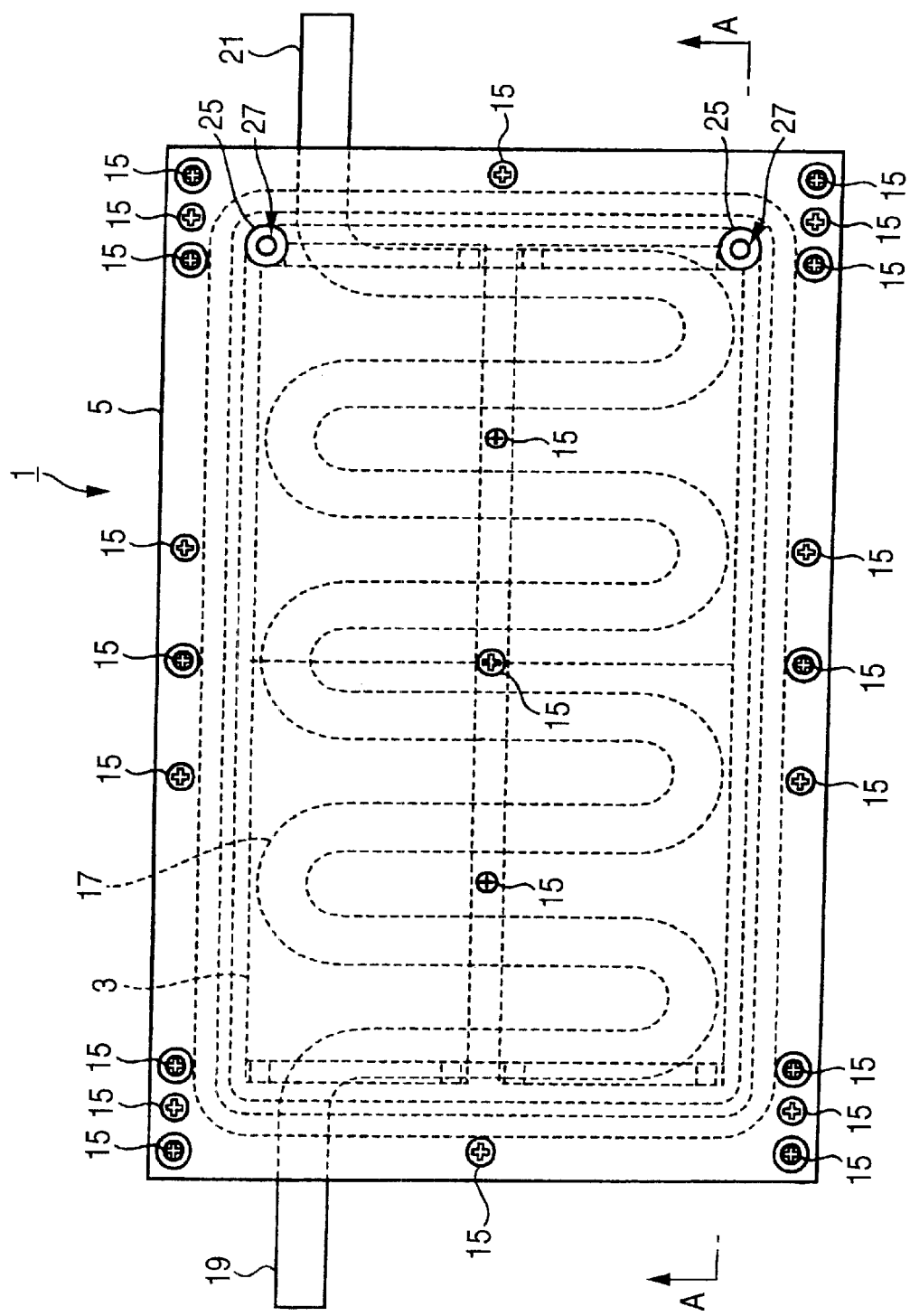
FIG. 1 is a plan view of the thermoelectric conversion device according to the first embodiment of the present invention.
Figure 2:
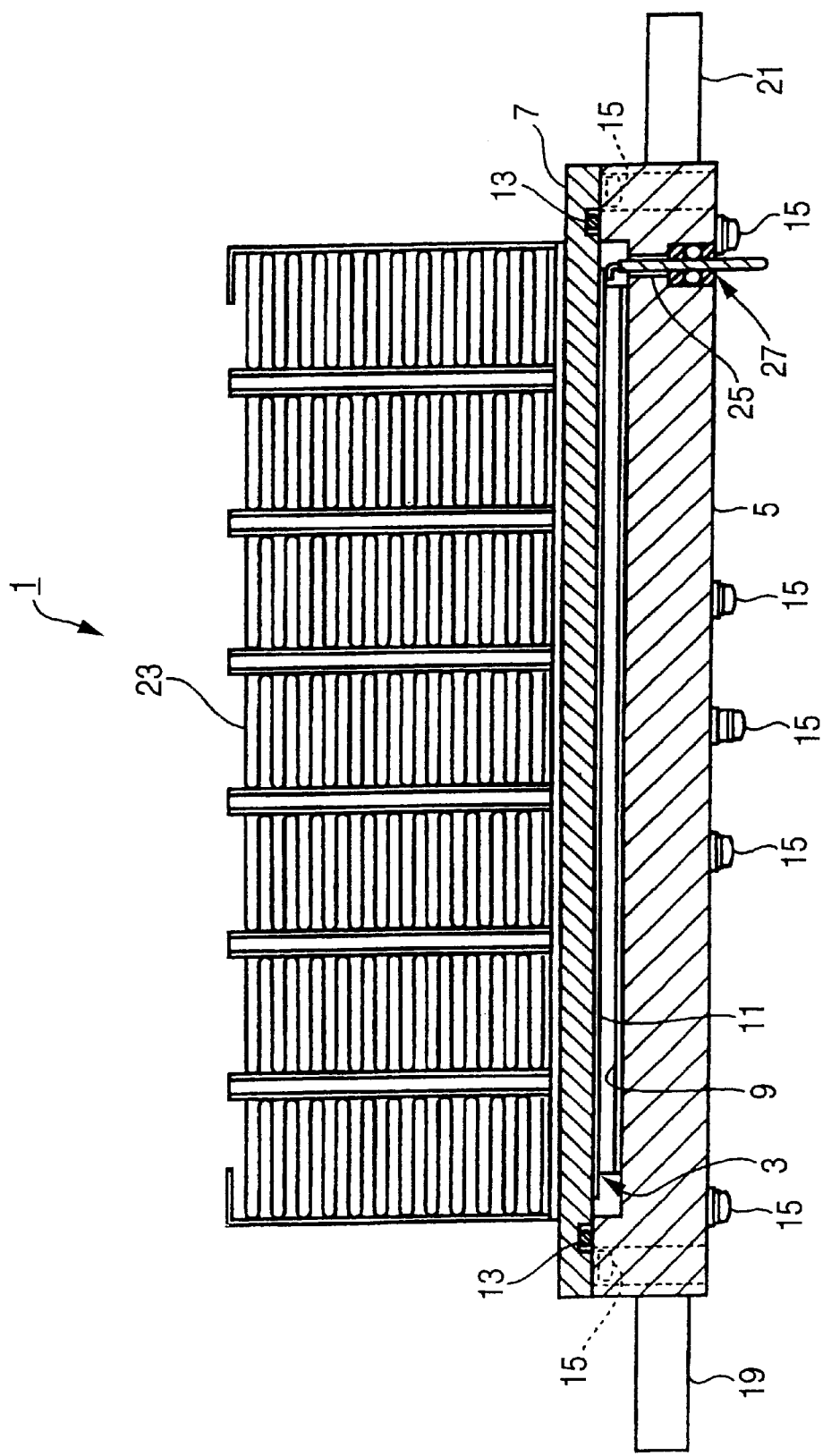
FIG. 2 is a cross sectional view of the same thermoelectric conversion device taken along the line A—A in FIG. 1.

FIG. 1 shows a plan view of the thermoelectric conversion device according to the first embodiment of the present invention, and FIG. 2 is a cross sectional view of the same thermoelectric conversion device taken along the line A—A of FIG. 1.

As shown in FIG. 1 and FIG. 2, the thermoelectric conversion device 1 has a sandwich construction in which the thermoelectric conversion circuit board 3 of rectangular flat surface is sandwiched between the two metal heat exchanger plates 5, 7 each having a rectangular flat surface of one size larger than that of the thermoelectric conversion circuit 3. The thermoelectric conversion circuit board 3 that constitutes the central layer of this sandwich construction (the specific internal construction is not shown because it is well known by those skilled in the art) comprises a number of P-type semiconductor devices and N-type semiconductor devices arranged in two dimensional matrix interposed between two insulating layers 9, 11 on which a number of pattern electrodes for electrically connecting the semiconductor devices in series are printed, adhered, or spray-formed on the inner surface thereof, and each device and each pattern electrode are soldered. The outer surfaces of those two insulating layers 9, 11 on the thermoelectric conversion circuit board 3 are in close contact with the inner surfaces of two heat exchanger plates 5, 7.

An O-ring 13 is interposed between the inner surfaces of the outer edge portions of the two heat exchanger plates 5, 7 disposed in the flat area positioned outside the flat area of the thermoelectric conversion circuit board 3 along the whole periphery thereof. Therefore, the o-ring 13 encloses the outer periphery of the thermoelectric conversion circuit board 3 completely. These two heat exchanger plates 5, 7 are tightened by mean of bolts 15, 15 . . . toward each other by sufficient strength at a plurality of locations such as the outer edge portion or the central portion thereof. Therefore, the O-ring 13 is crushed to the suitable extent between the two heat-exchanging plates 5, 7 and thus the outer surface of the O-ring 13 is in close intimate contact with the inner surfaces of the outer edge portions of the heat exchanger plates 5, 7. As a consequent, the O-ring 13 seals the gap between the outer edge portions of two heat exchanger plates 5, 7,and prevents outside water from entering the inner space where the thermoelectric conversion circuit board 3 exists. Though it is also possible to form a double sealing structure by filling an adhesive in the gap between the heat exchanger plates 5, 7 outside the O-ring 13, or fitting an additional O-ring in the gap outside the O-ring 13 as disclosed in Japanese Patent Laid-Open No. 207762/1994, according to the study of the inventors of the present invention, the sealing capability that is sufficient in practical use can be obtained with a single O-ring 13.

In this embodiment, as an example, the heat exchanger plate 5 located on the lower side in FIG. 2 out of two heat exchanger plates 5, 7 is used for heat absorption, and a serpentine fluid path 17 through which fluid to be cooled flows runs therein. The components designated by the reference numerals 19, 21 are an inlet pipe and an outlet pipe of the fluid path 17. The heat exchanger plate 7 located on the upper side in FIG. 2 is used for heat discharging, and a fin 23 for discharging the heat toward outside air is mounted on the outer surface. In contrast to it, it is also possible to absorb heat from outside air by the fin 23 provided in the heat exchanger plate 7 on the upper side, and to flow coolant in the fluid path 17 in the heat exchanger plate 5 on the lower side for discharging heat to the coolant.

In the flat area on the lower heat exchanger plate 5 within the O-ring 13 and outside the thermoelectric conversion circuit board 3 is formed with through holes 25, 25 at two locations thereof, and each through hole 25 passes linearly through the heat exchange plate 5 from the inner surface to the outer surface (vertically in the figure). Then, two connectors 27, 27 for connecting the thermoelectric conversion circuit board 3 to the power supply outside the device are inserted through these two through holes 25, 25 respectively.

Figure 3:
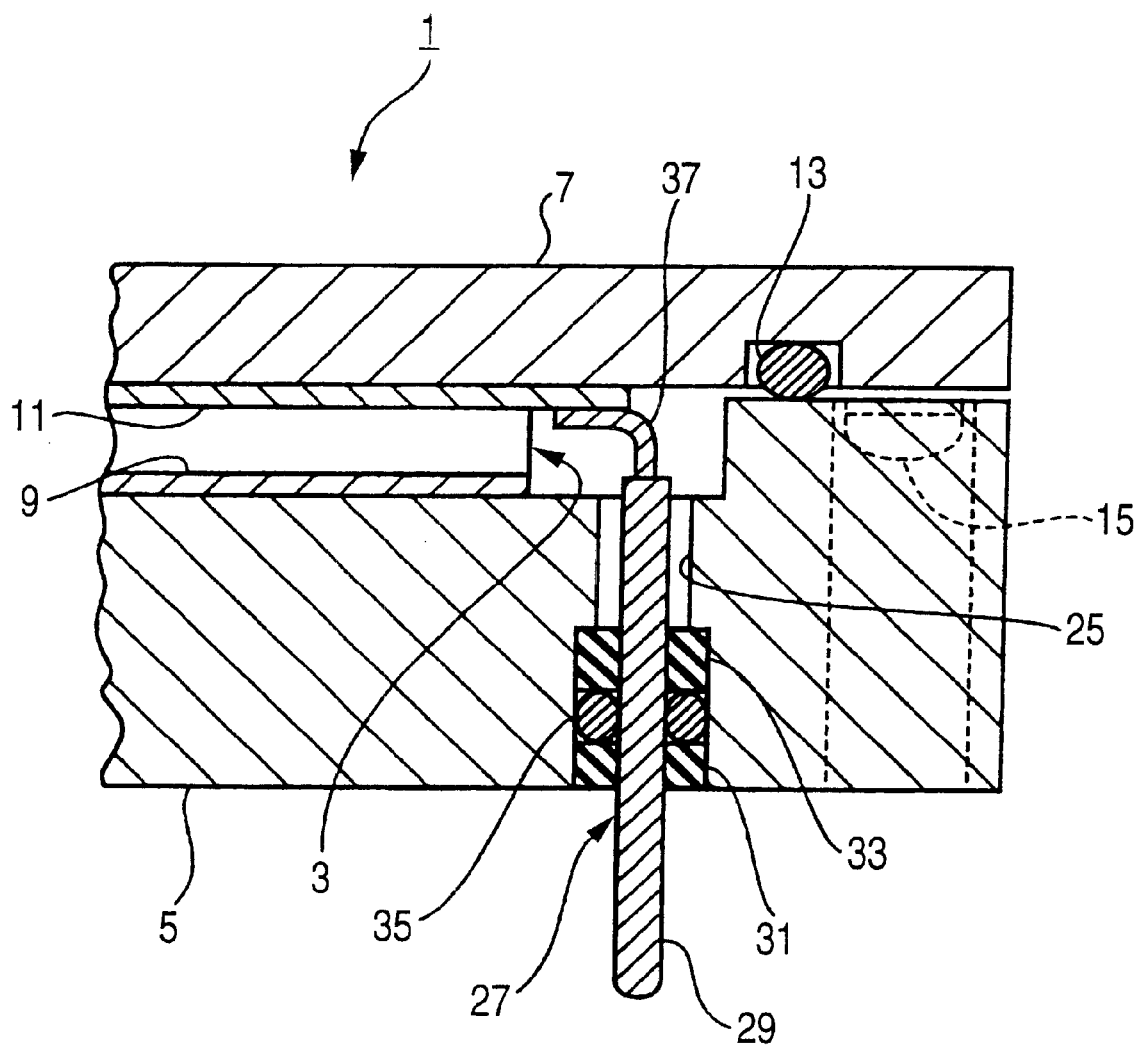
FIG. 3 is a cross sectional view showing the construction of the through hole 25 and the connector 27 more specifically.

FIG. 3 is a cross sectional view showing the construction of the through hole 25 and the connector 27 more specifically.

As shown in FIG. 3, the inner diameter of the through hole 25 is larger at the portion near the outside (lower side in the figure), and smaller at the portion near the inside (upper side in the figure). The connector 27 inserted into the through hole 25 comprises a metal pole bolt 29 of which the outer diameter is apparently smaller than the smaller inner diameter of the through hole 25, and two insulating collars 31, 33 formed of electrical insulating material and fitted on the pole bolt 29. These two insulting collars 31, 33 are disposed at a prescribed distance. The outer diameter of these two insulating collars 31, 33 is practically the same as the larger inner diameter of the through hole 25 (just slightly smaller by the extent corresponding to the allowance for enabling insertion into the through hole 25), or slightly smaller to the extent that does not unnecessarily rattle in the through hole 25. In addition, an O-ring 35 is fitted in the groove on the outer periphery of the pole bolt 29 positioned between these two insulating collars 31, 33, and a metal lead plate 37 for electrically connecting the pole bolt 29 to the thermoelectric conversion circuit board 13 is soldered at one of the tip of the pole bolt 29.

The connector 27 having the construction described above is manufactured in advance as a unit component. During manufacture, the pole bolt 29 and the insulating collars 31, 33 are fixed in close contact with each other. The connector 27 is rigid as a whole, and cannot be deformed practically (in other words, it is not as flexible as a simple lead (electric wire) disclosed in Japanese Patent Laid-Open No. 207762/1994). The rigid connector 27 thus fabricated as a unit component is inserted into the through hole 25 from the outside of the heat exchanger plate 5 with the end having a lead plate 37 foremost in the assembling process of the thermoelectric conversion device 1. As shown in the figure, insertion reaches completion when the insulating collar 33 on the tip abuts against the shoulder where the inner diameter of the through hole 25 decreases. The lead plate 37 on the tip of the pole bolt 29 is soldered to the prescribed pattern electrode on one of the insulating layer 11 of the thermoelectric conversion circuit board 3 (electrode for supplying power, not shown).

When the connector 27 is inserted completely into the through hole 25 as shown in the figure, the insulation collars 31, 33 fit almost exactly on the portion of the through hole 25 with the larger inner diameter. During insertion, the O-ring 35 fitted on the pole bolt 29 is crushed to the suitable extent and spontaneously brought into close intimate contact with the inner peripheral surface of the through hole 25 and the outer peripheral surface of the pole bolt 29, and the end surfaces of the insulating collars 31, 33. Accordingly, the O-ring 35 seals the gap between the through hole 25 and the connector 27 and prevents outside water from entering in the device. Here again, it is possible to form a double sealing structure by additionally sealing between the through hole 25 and the connector 27 with an adhesive, or by fitting the additional O-ring. However, as described above, according to the study of the inventors of the present invention, the sealing capability that is sufficient in practical use can be obtained with a single O-ring 35.

In the step of inserting the connector 27 to the through hole 25 described above, axial positioning of the connector 27 in the through hole 25 is automatically made by abutment between the front portion of the insulating collar 33 and the shoulder in the through hole 25. Concurrently, positioning of the connector 27 in the through hole 25 is also made automatically by abutment between the outer peripheral surface of the insulating collars 31, 33 and the inner peripheral surface of the through hole 25 or by the elastic force of the O-ring 35. Such an automatic positioning capability facilitates the process of operation and prevents rattling of the connector 27 in the through hole 25 to ensure the sealing effect of the O-ring 35 described above. The fact that the O-ring 35 forms a seal spontaneously by inserting the connector 27 in the through hole 25 also facilitates the process of operation.

As is clear from the description described above, the thermoelectric conversion device 1 according to this embodiment can be manufactured easily and exhibits the reliable sealing effect.

Referring now to FIG. 4 to FIG. 8, some other embodiment of the present invention will be described. In the description below, the components that are considered to have practically the same function as the components of the first embodiment described above (even when the configurations are somewhat different) and that can be understood by those skilled in the art without specific description will be designated by the same reference numerals in the figure as in the first embodiment, and redundant description will be omitted.

Figure 4:
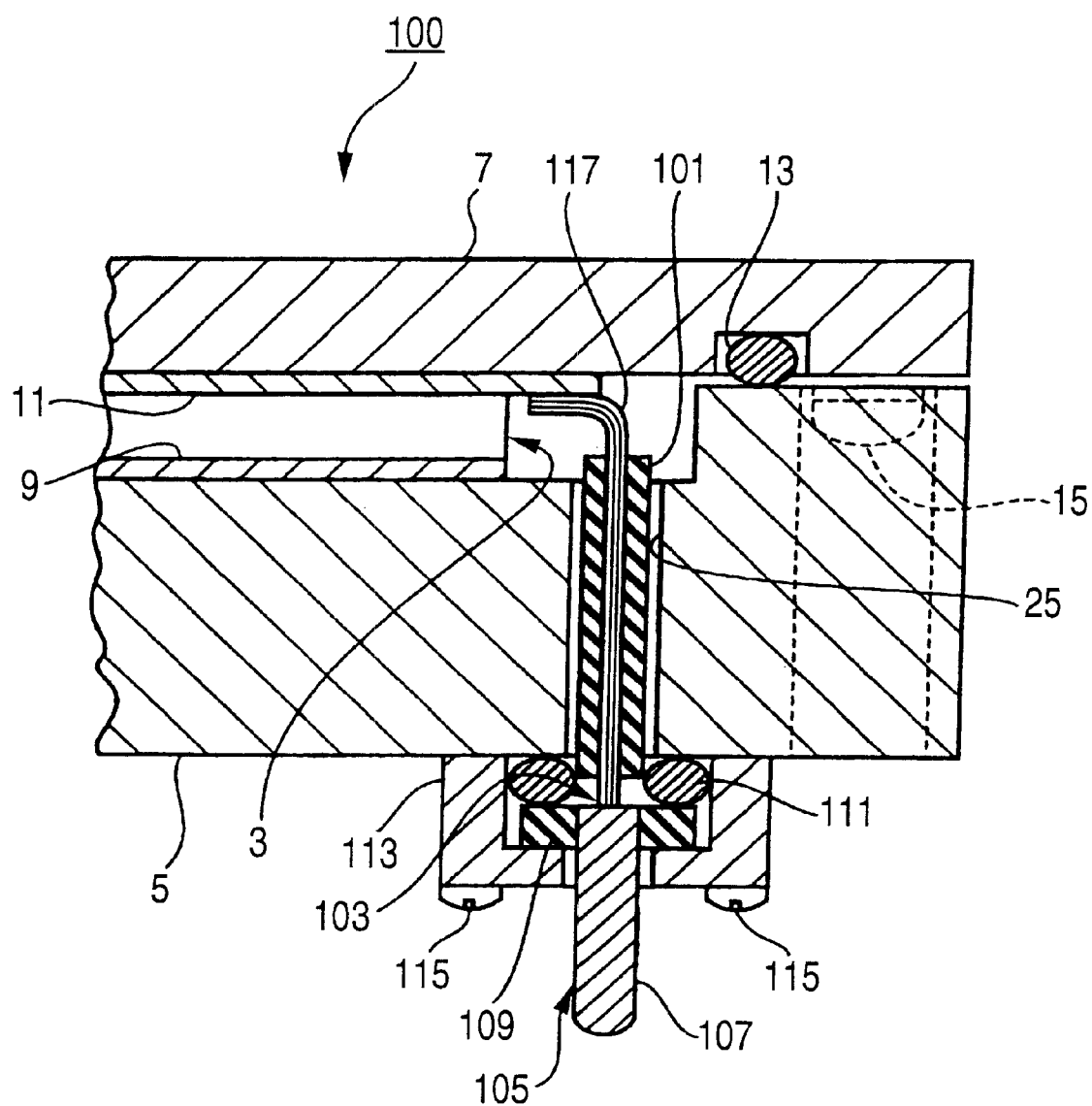
FIG. 4 is a cross sectional view of the thermoelectric conversion device 100 according to the second embodiment of the present invention showing the part to be connected with the external power supply.

FIG. 4 is a cross sectional view of the thermoelectric conversion device 100 according to the second embodiment of the present invention showing the part to be connected with the external power supply.

In this thermoelectric conversion device 100, a coated electric wire 101 that constitutes a part of the connector 105 for connection to the external power supply is inserted through the through hole 25 formed on the lower heat exchanger plate 5, and the core 117 at the tip portion of the coated electric wire 101 that is accommodated in the device 100 is soldered to the pattern electrode (not shown) for supplying power on one of the insulating layer 11 of the thermoelectric conversion circuit board 13. The core 103 at the tip portion of the coated electric wire 101 outside the heat exchanger plate 5 is soldered with the metal pole bolt 107 constituting the tip portion of the connector 105. The proximal portion of the pole bolt 107 is fitted with a flange 109 formed of electric insulation material thereon. The connector 105 is manufactured as a unit component in advance, and the pole bolt 107 and the flange 109 are fixed in close contact with each other.

The portion of the connector 105 located on the reverse side of the flange 109 is fitted with an O-ring 111 thereon, so that the O-ring 111 is interposed between the flange 109 and the heat exchanger plate 5 when the coated electric wire 101 of the connector 105 is inserted within the through hole 25. Then, the pole bolt 105 is covered by a connector cover 113 having a hole for leading only the pole bolt 107 out from outside, and fixed to the heat exchanger plate 5 by the bolts 115, 115 . . . , whereby the flange 109 of the connector 105 is pressed toward the heat exchanger plate 5 by a strong force from outside to fix the connector 105 at a prescribed position. When performing this fixation, the O-ring 111 is crushed to the suitable extent between the flange 109 and the heat exchanger plate 5 spontaneously and brought into close contact with the surfaces near the entrances of the through holes 25 of the flange 109 and the heat exchanger plate 5, thereby sealing the gap between the pole bolt 105 spontaneously and the through hole 25 to prevent outside water from entering inside.

Figure 5:
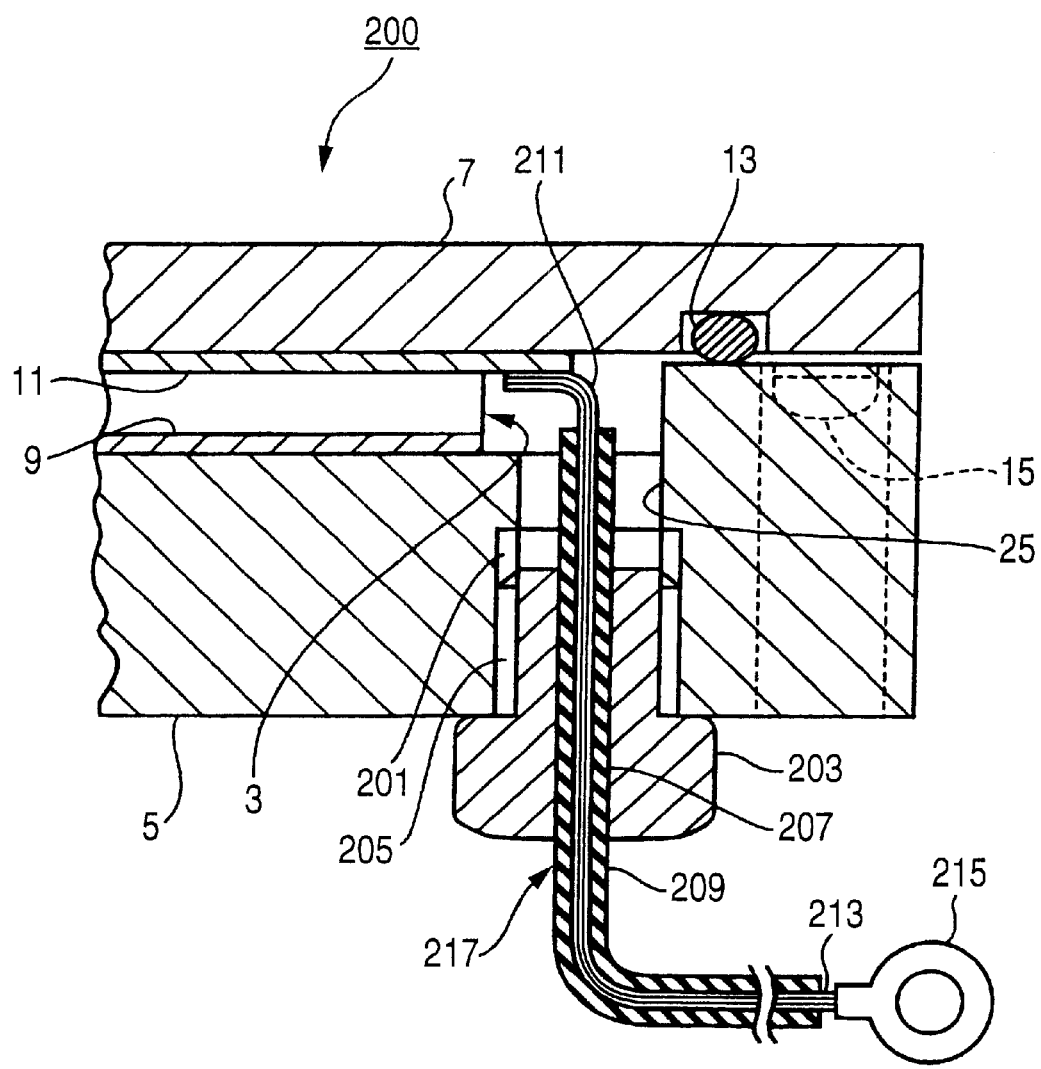
FIG. 5 is a cross sectional view of the thermoelectric conversion device 200 according to the third embodiment of the present invention showing the part to be connected with the external power supply.

FIG. 5 is a cross sectional view of the thermoelectric conversion device 200 according to the third embodiment of the present invention showing the part to be connected with the external power supply.

In the thermoelectric conversion device 200, a female screw 201 is formed on the inner surface of the through hole 25 formed on the lower heat exchanger plate 5, with which the screw bolt 203 is engaged. The periphery of the male screw 205 of the screw bolt 203 is wrapped with the known sealing tape (not shown) before it is engaged with the female screw 201. Therefore, when the screw bolt 203 is inserted into the through hole 25, the sealing tape seals the gap between the screw bolt 203 and the through hole 25 spontaneously to prevent outside water from entering inside.

A through hole 207 is formed through the center of the screw bolt 203 along the central axis thereof, and a coated electric wire 209 is inserted through the through hole 207. The core 211 at the tip portion of the coated wire 209 that is accommodated in the device 200 is soldered on the pattern electrode for power supply (not shown) on one of the insulating layer 11 of the thermoelectric conversion circuit plate 3. The core 213 at the tip portion of the coated electric wire 209 outside the device 200 is fitted with a ring electrode 215 by crimping or by soldering.

The screw bolt 203 and the coated electric wire 209 described above constitute a connector 217 for connection to the external power supply. The connector 217 is manufactured as a unit component in advance. The inner diameter of the through hole 207 of the screw bolt 203 is constant, and the outer diameter of the coated electric wire 209 is substantially the same as the inner diameter of the through hole 207. The inner surface of the through hole 207 and the outer surface of the coated electric wire 209 are fixed in close contact with each other.

Figure 6:
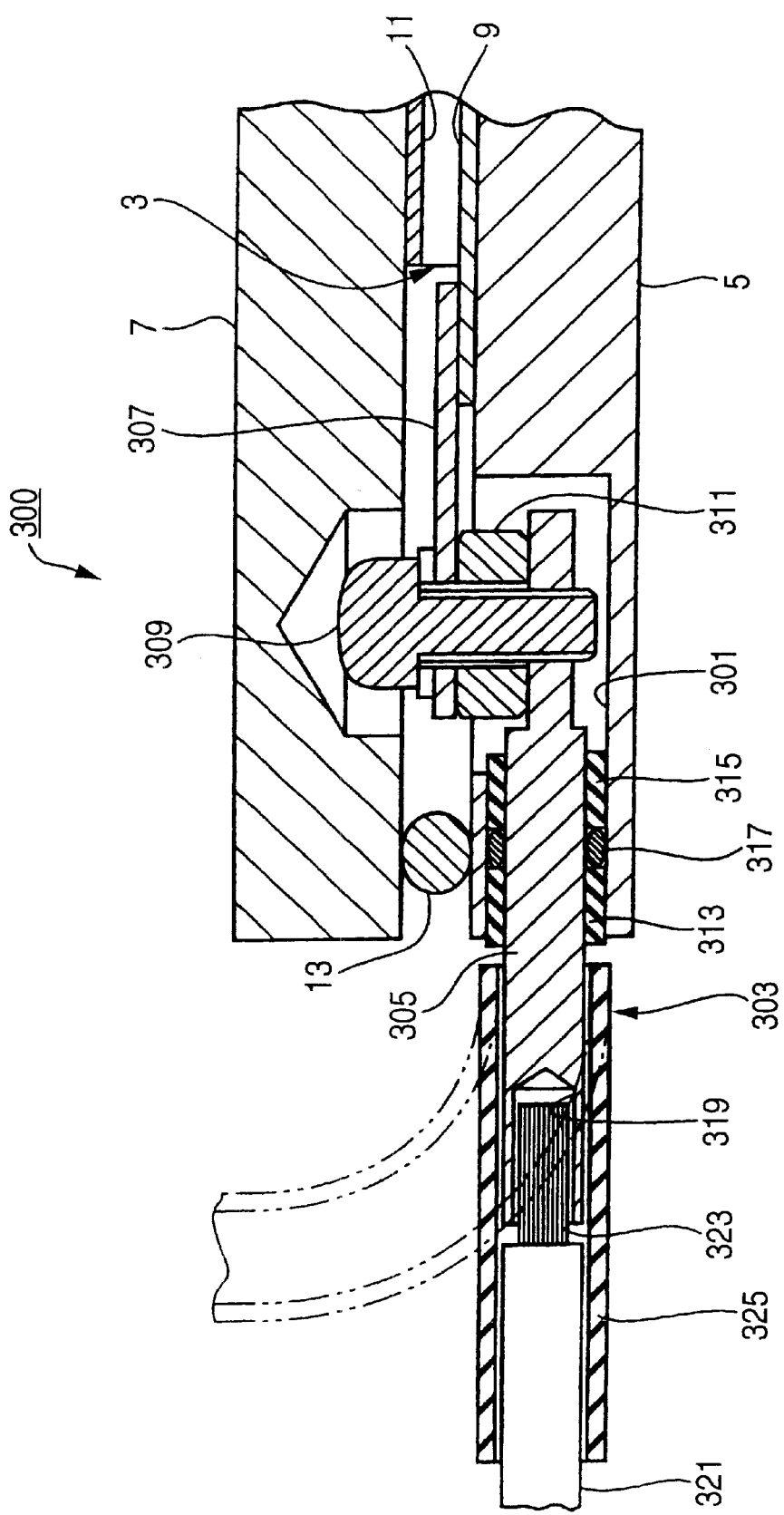
FIG. 6 is a cross sectional view of the thermoelectric conversion device 300 according to the fourth embodiment of the present invention showing the part to be connected with the external power supply.

FIG. 6 is a cross sectional view of the thermoelectric conversion device 300 according to the fourth embodiment of the present invention showing the part to be connected with the external power supply.

In the thermoelectric conversion device 300, the connector 303 to be connected to the external power supply extends sideways from the side surface of the device 300. In other words, a through hole 301 of L-shape in cross section is formed through the lower heat exchanger plate 5 from the upper inside surface to the outer side surface thereof, and a connector 303 is inserted through the through hole 301. The connector 303 comprises a pole bolt 305 inserted through the portion of the through hole 301 extending sideway, a lead plate 307 electrically connected to the thermoelectric conversion circuit board 3 in the device 300, and a screw bolt 309 for connecting and fixing the tip portion of the pole bolt 305 that is accommodated in the device 300 and the tip portion of the lead plate 307 via a spacer nut 311.

The portion of the pole bolt 305 inserted into the through hole 301 is fitted with two insulating collars 313, 315 thereon, and an O-ring 317 is fitted between these two insulating collars 313, 315. Since the outer diameter of the insulating collars 313, 315 is almost the same as the inner diameter of the portion of the through hole 301 extending sideway in which they are inserted, the connector 303 does not unnecessarily rattle in the through hole 301. When the O-ring 317 is inserted into the through hole 301 together with the pole bolt 305, the O-ring is brought into close contact with the outer peripheral surface of the pole bolt 305 and the inner peripheral surface of the through hole 301 spontaneously to seal the gap formed between them.

The portion of the pole bolt 305 outside the heat exchanger plate 5 is formed with a hole 319 at the tip thereof, and a core 323 at the end of the coated wire 321 is inserted in the hole 319. The joint between the pole bolt 305 and the coated wire 321 is fastened up so as not to be detached by means of a thermal shrinking tube 325 in a flexible state.

Figure 7:
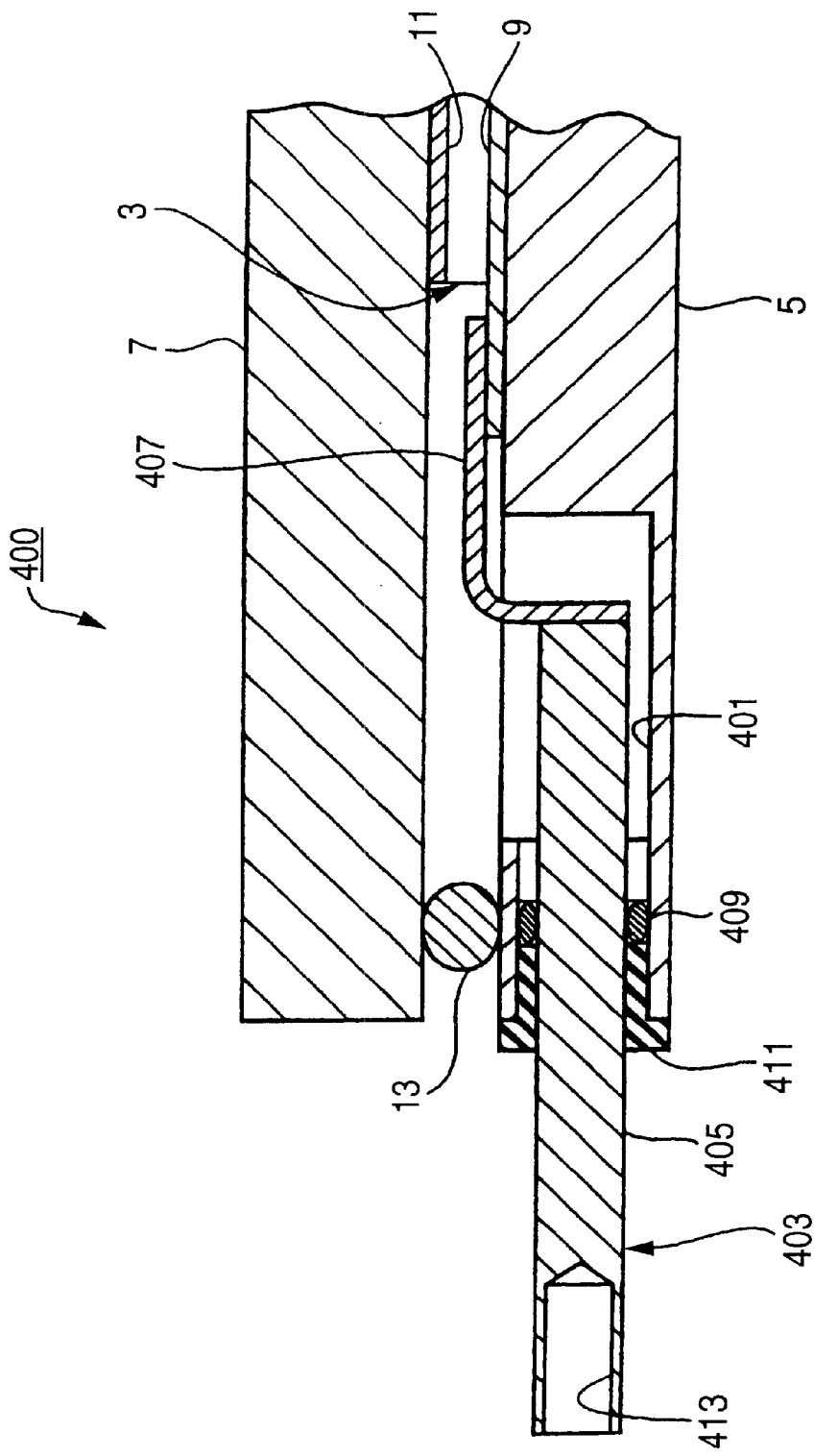
FIG. 7 is a cross sectional view of the thermoelectric conversion device 400 according to the fifth embodiment of the present invention showing the part to be connected with the external power supply.

FIG. 7 is a cross sectional view of the thermoelectric conversion device 400 according to the fifth embodiment of the present invention showing the part to be connected with the external power supply.

In this thermoelectric conversion device 400 as well, the connector 403 to be connected with the external power supply extends sideways from the side surface of the device 400. In other words, a through hole 401 of L-shape in cross section is formed through the lower heat exchanger plate 5 from the upper inside surface to the outer side surface thereof, and a connector 403 is inserted through the through hole 401. The connector 403 comprises a pole bolt 405 inserted through the portion of the through hole 401 extending sideway, and a lead plate 407 soldered to the tip portion of the pole bolt 405 that is accommodated in the device 400 and electrically connected to the thermoelectric conversion circuit board 3 in the device 400.

The portion of the pole bolt 405 inserted into the through hole 401 is fitted with an O-ring 409 and an insulating collar 411 thereon. Since the outer diameter of the insulating collar 411 is almost the same as the inner diameter of the portion of the through hole 401 extending sideways in which it is inserted, the connector 403 does not unnecessarily rattle in the through hole 401. When the O-ring 409 is inserted into the through hole 401 together with the pole bolt 405, the O-ring is brought into close contact with the outer peripheral surface of the pole bolt 405 and the inner peripheral surface of the through hole 401 spontaneously to seal the gap formed between them. The portion of the pole bolt 405 outside the heat exchanger plate 5 is formed with a hole 413 at the tip thereof, to which the coated electric wire can be connected as in the case shown in FIG. 6.

Figure 8:
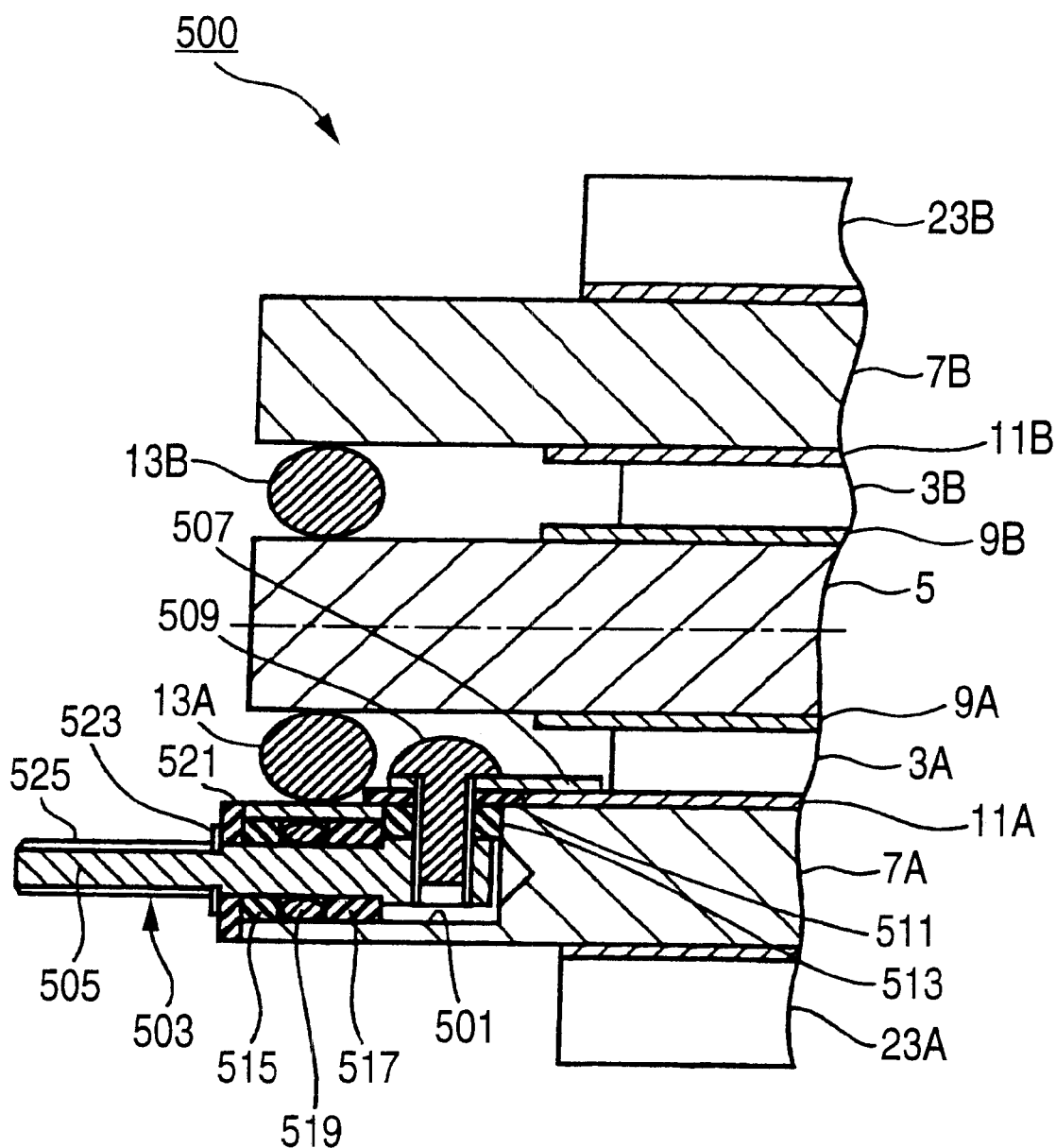
FIG. 8 is a cross sectional view of the thermoelectric conversion device 500 according to the sixth embodiment of the present invention showing the part to be connected with the external power supply.

FIG. 8 is a cross sectional view of the thermoelectric conversion device 500 according to the sixth embodiment of the present invention showing the part to be connected with the external power supply.

The thermoelectric conversion device 500 is practically symmetrical in construction about the centerline shown by a dashed line. In other words, on one of the sides of the central heat exchanger plate 5, there is a structure including a thermoelectric conversion circuit board 3A interposed between this heat exchanger plate 5 and another heat exchanger plate 7A, and on the other side of the central heat exchanger plate 5, there is another structure including a thermoelectric conversion circuit board 3B interposed between this heat exchanger plate 5 and still another heat exchanger plate 7B. The central heat exchanger plate 5 is used, for example, for absorbing heat (or discharging heat), and there is formed a path (not shown) therein, through which fluid to be cooled (or fluid for cooling) flows. The heat exchanger plates 7A, 7B on both sides are used, for example, for discharging heat (or absorbing heat), and a heat discharging fins (or a heat absorbing fins) 23A, 23B are mounted on the the outer surface thereof.

A through hole 501 of L-shape in cross section is formed through the lowermost heat exchanger plate 7A in the figure from the upper inside surface to the outer side surface thereof, and a connector 503 for connecting the lower thermoelectric conversion circuit board 3A to the external power supply is inserted through the through hole 501. The connector 503 comprises a pole bolt 505 inserted through the portion of the through hole 501 extending sideway, a lead plate 507 electrically connected to the thermoelectric conversion circuit board 3A in the device 500, and a screw bolt 509 for connecting and fixing the tip portion of the pole bolt 505 that is accommodated in the device 500 and the tip portion of the lead plate 507 via insulating spacers 511, 513.

The portion of the pole bolt 505 inserted into the through hole 501 is fitted with two insulating collars 515, 517 thereon, and an O-ring 519 is fitted between these two insulating collars 515, 517. Since the outer diameter of the insulating collars 515, 517 is almost the same as the inner diameter of the portion of the through hole 501 extending sideway in which they are inserted, the connector 503 does not unnecessarily rattle in the through hole 501. When the O-ring 519 is inserted into the through hole 501 together with the pole bolt 505, the O-ring is brought into close contact with the outer peripheral surface of the pole bolt 505 and the inner peripheral surface of the through hole 501 spontaneously to seal the gap formed between them.

An insulating spacer 521 is fitted on the portion of pole bolt 505 corresponding exactly to the entrance of the through hole 501, and a C-shaped catch 523 is fitted on the pole bolt 505 from outside thereof, which contributes to fix the connector 503 at a prescribed position. The outer periphery of the portion of the pole bolt 505 outside of the device 500 is threaded with male screw 525, to which the electric wire or the like can be connected via a nut.

Though it is not shown in the figure, the uppermost heat exchanger plate 7B in the figure is mounted with a connector for connecting the upper thermoelectric conversion circuit board 3B to the external power supply in the same construction as in the case described above. When the upper thermoelectric conversion circuit board 3B and the lower thermoelectric conversion circuit board 3A are electrically connected within the device 500 (for example by the electric wiring passing through the central heat exchanger plate 5), it is not necessary to provide a connector on the upper heat exchanger plate 7B, as a matter of course.

Though several embodiments of the present invention have been described thus far, these embodiments shown here are intended only to describe the present invention, and not intended to limit the present invention to those embodiments. Therefore, the present invention may be embodied in other various forms other than those shown here.

What is claimed is:

1. A thermoelectric conversion device comprising:

a thermoelectric conversion circuit interposed between two plates, the plates respectively having an inner surface and an outer surface, wherein at least one of the two plates has a through hole from the inner surface to the outer surface through the plate;

an outer edge sealing member for enclosing an outer periphery of the thermoelectric conversion circuit to seal a gap between outer edge portions of the two plates;

a connector passed through the through hole and connected at one end to the thermoelectric conversion circuit for connecting the thermoelectric conversion circuit to an external power supply; and a connector sealing member that is constructed to seal a gap between the connector and the through hole spontaneously when the connector is inserted through the through hole and fixed at a prescribed position.

2. A thermoelectric conversion device as set forth in claim 1, wherein the connector sealing member is an O-ring fitted on the out of the connector and brought into close contact with the surface of the connector and the inner peripheral surface of the through hole or the surface of the plate around the through hole.

3. A thermoelectric conversion device as set forth in claim 1, wherein the outer diameter of the portion of the connector inserted into the through hole is almost the same as the inner diameter of the through hole.

4. A thermoelectric conversion device as set forth in claim 1, wherein the through hole extends through the plate from the inner surface to the outer surface on a side of the plate.

* * * * *